(12) United States Patent
Call et al.

(10) Patent No.: US 6,297,559 B1
(45) Date of Patent: *Oct. 2, 2001

(54) STRUCTURE, MATERIALS, AND APPLICATIONS OF BALL GRID ARRAY INTERCONNECTIONS

(75) Inventors: Anson J. Call, Poughkeepsie; Stephen Anthony DeLaurentis, Claverack; Shaji Farooq, Hopewell Junction; Sung Kwon Kang, Chappaqua; Sampath Purushothaman, Yorktown Heights; Kathleen Ann Stalter, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/107,998

(22) Filed: Jun. 30, 1998

Related U.S. Application Data

(60) Provisional application No. 60/052,175, filed on Jul. 10, 1997.

(51) Int. Cl.⁷ .................................................. H01L 23/48
(52) U.S. Cl. ........................... 257/778; 257/738; 257/779; 257/780; 228/180.22; 361/760; 361/768; 361/779
(58) Field of Search ..................................... 257/737, 738, 257/778, 779, 780, 781, 782, 783, 788, 789; 228/180.21, 180.22; 29/830, 840; 361/760, 768, 779; 438/108, 612, 613

(56) References Cited

U.S. PATENT DOCUMENTS

| | | | |
|---|---|---|---|
| 3,839,727 | * 10/1974 | Herdzik et al. | 257/737 |
| 4,701,482 | * 10/1987 | Itoh et al. | 523/435 |
| 5,060,844 | * 10/1991 | Behun et al. | 228/180.2 |
| 5,062,896 | * 11/1991 | Huang et al. | 29/840 |
| 5,134,460 | * 7/1992 | Brady et al. | 257/737 |
| 5,137,845 | 8/1992 | Lochon et al. | 438/614 |

(List continued on next page.)

Primary Examiner—Olik Chaudhuri
Assistant Examiner—Alonzo Chambliss
(74) Attorney, Agent, or Firm—Connolly Bove Lodge & Hutz; Daniel P. Morris

(57) ABSTRACT

A new interconnection scheme of a ball grid array (BGA) module is disclosed where a solder ball is connected to the BGA module by use of an electrically conducting adhesive The electrically conducting adhesive can be a mixture comprising a polymer resin, no-clean solder flux, a plurality of electrically conducting particles with an electrically conducting fusible coating and others. The solder balls in a BGA module can also be connected to a printed circuit board by use of another electrically conductive adhesive which can be joined at a lower temperature than the first joining to the BGA module. Additionally, an electrically conducting adhesive can be formed into electrically conducting adhesive bumps which interconnect an integrated circuit device to the BGA module.

42 Claims, 3 Drawing Sheets

U.S. PATENT DOCUMENTS

| | | | | |
|---|---|---|---|---|
| 5,147,084 | * | 9/1992 | Behun et al. | 228/56.3 |
| 5,237,130 | | 8/1993 | Kulesza et al. | 174/260 |
| 5,241,133 | | 8/1993 | Mullen, III et al. | 174/52.4 |
| 5,258,577 | * | 11/1993 | Clements | 174/88 |
| 5,328,087 | * | 7/1994 | Nelson et al. | 228/175 |
| 5,355,283 | | 10/1994 | Marrs et al. | 361/760 |
| 5,367,765 | | 11/1994 | Kusaka | 29/840 |
| 5,420,460 | | 5/1995 | Massingill | 257/693 |
| 5,445,308 | * | 8/1995 | Nelson et al. | 228/121 |
| 5,459,287 | | 10/1995 | Swamy | 174/266 |
| 5,591,941 | * | 1/1997 | Acocella et al. | 174/266 |
| 5,604,379 | * | 2/1997 | Mori | 257/738 |
| 5,611,140 | | 3/1997 | Kulesza et al. | 29/832 |
| 5,634,268 | * | 6/1997 | Dala et al. | 29/840 |
| 5,672,400 | | 9/1997 | Hansen et al. | 428/40.1 |
| 5,672,913 | * | 9/1997 | Baldwin et al. | 257/737 |
| 5,681,647 | | 10/1997 | Caillat | 428/209 |
| 5,714,252 | | 2/1998 | Hogerton et al. | 428/344 |
| 5,729,896 | * | 3/1998 | Dalal et al. | 29/840 |
| 5,761,048 | * | 6/1998 | Trabucco | 361/760 |
| 5,762,259 | | 6/1998 | Hubacher et al. | 228/180.22 |
| 5,783,461 | | 7/1998 | Hembree | 438/17 |
| 5,796,591 | * | 8/1998 | Dala et al. | 361/779 |
| 5,813,870 | | 9/1998 | Gaynes et al. | 439/91 |
| 5,844,168 | | 12/1998 | Schueller et al. | 174/52.4 |
| 5,861,322 | | 1/1999 | Caillat et al. | 438/107 |
| 5,864,470 | | 1/1999 | Shim et al. | 361/777 |
| 5,868,304 | | 2/1999 | Brofman et al. | 228/254 |
| 5,872,051 | * | 2/1999 | Fallon et al. | 438/616 |
| 5,879,530 | | 3/1999 | Caillat | 205/122 |
| 5,918,113 | | 6/1999 | Higashi et al. | 438/119 |
| 5,943,212 | | 8/1999 | Horiuchi et al. | 361/704 |
| 5,953,589 | | 9/1999 | Shim et al. | 438/106 |
| 5,958,590 | * | 9/1999 | Kang et al. | 428/403 |
| 5,985,043 | | 11/1999 | Zhou et al. | 148/24 |
| 5,985,456 | * | 11/1999 | Zhou et al. | 428/414 |
| 6,010,060 | * | 1/2000 | Sarkhel et al. | 228/179.1 |
| 6,017,634 | | 1/2000 | Capote et al. | 428/414 |
| 6,059,952 | | 5/2000 | Kang et al. | 205/143 |
| 6,114,413 | * | 9/2000 | Kang et al. | 523/210 |
| 6,120,885 | * | 9/2000 | Call et al. | 428/209 |

* cited by examiner

STRUCTURE, MATERIALS, AND APPLICATIONS OF BALL GRID ARRAY INTERCONNECTIONS

The application claims benefit of provisional application Ser. No. 60/052,175 filed Jul. 10, 1997.

CROSS REFERENCE TO RELATED APPLICATIONS

This application contains subject matter that is also contained in U.S. application Ser. No. 09/106,780, filed on Jun. 30, 1998, now pending "Interconnections with Electrically Conductive Adhesives: Structures, Materials, Methods and Their Applications", filed on even date, and U.S. application Ser. No. 09/107,998, filed on Jun. 30, 1998, now pending "Structure, Materials and Methods for Socketable Ball Grid Array Interconnections", filed on even date, disclosure of which are incorporated herein by reference.

TECHNICAL FIELD

The present invention relates generally to techniques for connecting an electronic device to external circuitry, and more particularly to ball grid array interconnections between microelectronic packages and printed circuit boards.

BACKGROUND OF INVENTION

Rapid advances in microelectronic devices are continuously demanding a finer pitch connection between electronic packages and a printed circuit board (about a few hundred micrometer pitch or less). To meet this demand as well as the demand for low cost electronic packages, surface mount technology (SMT) has expanded its share over the conventional plated-through-hole (PTH) technology for the last twenty years. At present, more than two thirds of integrated circuits (IC) including both memory and logic devices are assembled by SMT. SMT packages commonly found in a PCB are leaded chip carriers such as small outline integrated circuits (SOIC), plastic leaded chip carrier (PLCC), quad flat pack (QFP), thin small outline package (TSOP), or tape carrier package (TCP). These leaded chip carriers, mostly plastic packages, depend on a perimeter connection between an IC package and a PCB. The perimeter connection scheme of SMT packages has reached its limitation in terms of connection pitch and I/O capability.

To relieve the limitations of perimeter connections and thereby to increase the packaging density, area array connection schemes have recently become popular. Some of the area array packages developed for SMT include ball grid array (BGA) package, solder column grid array (SCGA), direct chip attach (DCA) to PCB by flip chip connection, tape ball grid array (TBGA), or chip scale packages (CSP). Among them, BGA is the most popular one, where solder balls connect a module carrying an IC to a PCB. This technology is an extension of the controlled collapse chip connection (C4) scheme originally developed for solder bump connection of multiple chips to a ceramic substrate.

The IC on the module can be connected to the module in several ways as taught by Mulles et al., U.S. Pat. No. 5,241,133; Massingill, U.S. Pat. No. 5,420,460; and Marrs et al., U.S. Pat. No. 5,355,283 among others. Ceramic or organic module substrates can be employed depending on the performance, weight and other requirements. The common feature, however, is that the connection between the IC carrier and the next level PCB is accomplished by an array of solder balls which are attached to the module by a solder alloy with a lower melting temperature.

BGA packages have several advantages over the conventional leaded chip carriers: small and low profile package, large, standard pitch for a same I/O count, high assembly yield due to self-alignment, rugged package (no lead deformation), better electrical/thermal performance, and compatible with SMT assembly process. A few drawbacks of BGA packages are noted such as a difficulty of visual inspection of solder joints, cost issues of BGA modules, control of solder ball connection process, lack of field reliability data, and others.

There are several options depending on the choice of module materials, such as plastic BGA, ceramic BGA, and tape BGA. Ceramic BGA is more costly than plastic BGA, but it has a better proven reliability over the plastic BGA. However, one major weakness of ceramic BGA is a large mismatch of thermal coefficient of expansion (TCE) between a ceramic module and a polymeric PCB. This limits the maximum size of ceramic BGA module to be mounted on a PCB, which is about 32 mm$^2$ with state-of-art technology. For a ball pitch of 50 mil, this BGA module can have about 625 I/O connections. Plastic BGA is better in terms of TCE mismatch because of a better materials compatibility between the module and the PCB substrate materials. Since most of plastic BGA's have a perimeter connection to a chip by wire bonding, the overall packaging density is much lower than that of a ceramic BGA which has an area array connection to a chip by flip chip or C4 technology.

FIG. 1 schematically illustrates the cross section of a ceramic BGA module 13 connected to an organic substrate 15 by use of a two dimensional array of solder balls 14. On the BGA module 13, an IC chip 11 is already attached to it by another array of smaller solder bumps 12.

Solder balls used are typically 90% Pb–10% Sn in composition for ceramic BGA, 63% Sn–37% Pb eutectic solder for plastic BGA. As schematically shown in FIG. 2, the solder ball 24 is connected by reflowing Sn—Pb eutectic solder paste 23 as commonly used in SMT soldering. During the reflow of ceramic BGA, only the Sn—Pb eutectic solder paste 23 is melted, not the solder ball 24 of a high melting temperature. During the reflow process, several reactions occur simultaneously at the soldering interfaces; dissolution of terminal metalluriges such as Au or Cu layer into the molten Sn—Pb eutectic solder, formation of Sn-containing intermetallic phases, interdiffusion of Sn and Pb across the liquid-solid interface, void formation in the solidifying Sn—Pb eutectic solder paste materials, and others. These reactions would affect the joint integrity or degrade the long-term reliability. The large mismatch in thermal expansion coefficients between a ceramic module 21 and an organic printed circuit board 26, often causes thermal fatigue failure along the interface 22,25 close to the ceramic module during a thermal cycling test. In order to improve the joint integrity and reliability, several solutions have been proposed; replacing Pb-rich solder balls with more flexible materials or placing a diffusion barrier layer on solder balls to prevent interdiffusion, or using a different joining material other than solders such as electrically conductive adhesives like Ag-filled epoxy.

SUMMARY OF INVENTION

In accordance with the present invention, a strong and compliant interconnection of BGA to ceramic or plastic substrates is made possible. Moreover, the present invention makes it possible to provide a stable BGA joint structure which does not cause an excessive interdiffusion between solder balls and adjoining solder paste. Also, according to the present invention, a BGA structure which gives a longer fatigue life can be obtained. Furthermore, it is possible according to the present invention to provide a joining material and method which can handle a larger module size than that of the standard EGA module.

More particularly, an aspect of the present invention is an interconnection scheme of ball grid array packages to ceramic and organic substrates by an application of an electrically conductive material formed from a plurality of conducting particles. Each conducting particle has an electrically conductive coating which is fused to an electrically conductive coating on an adjacent particle to form a network of fused conducting particles.

Another aspect of the present invention is to replace lead (Pb)-containing solder paste material by Pb-free conducting material for the assembly of BGA packages.

A still further aspect of the present invention is a method of forming an electrically conductive joint between a solder ball and a contact pad by forming a paste of particles having an electrically conductive coating and a polymeric material wherein the paste is disposed to be adhesively and electrically joined. Heat and pressure are provided to fuse the electrically conductive particles to themselves, and to metallurgically bond them to the contact pads.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

Further objects, features, and advantages of the present invention will become apparent from a consideration of the following detailed description of the invention when read in conjunction with the drawing FIGS., in which.

BEST AND VARIOUS MODES FOR CARRYING OUT INVENTION

In order to facilitate an understanding of the present invention, reference will be made to the drawings.

Figure 1:
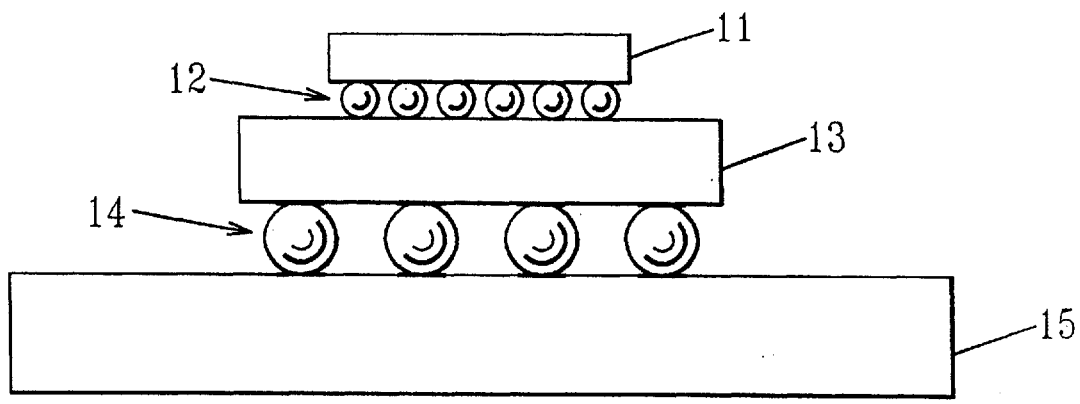
FIG. 1 is a schematic cross-sectional illustration representing a prior art ball grid array (BGA) module mounted on a PCB, while an IC chip is also connected to the module by flip chip solder bumps.
Figure 2:
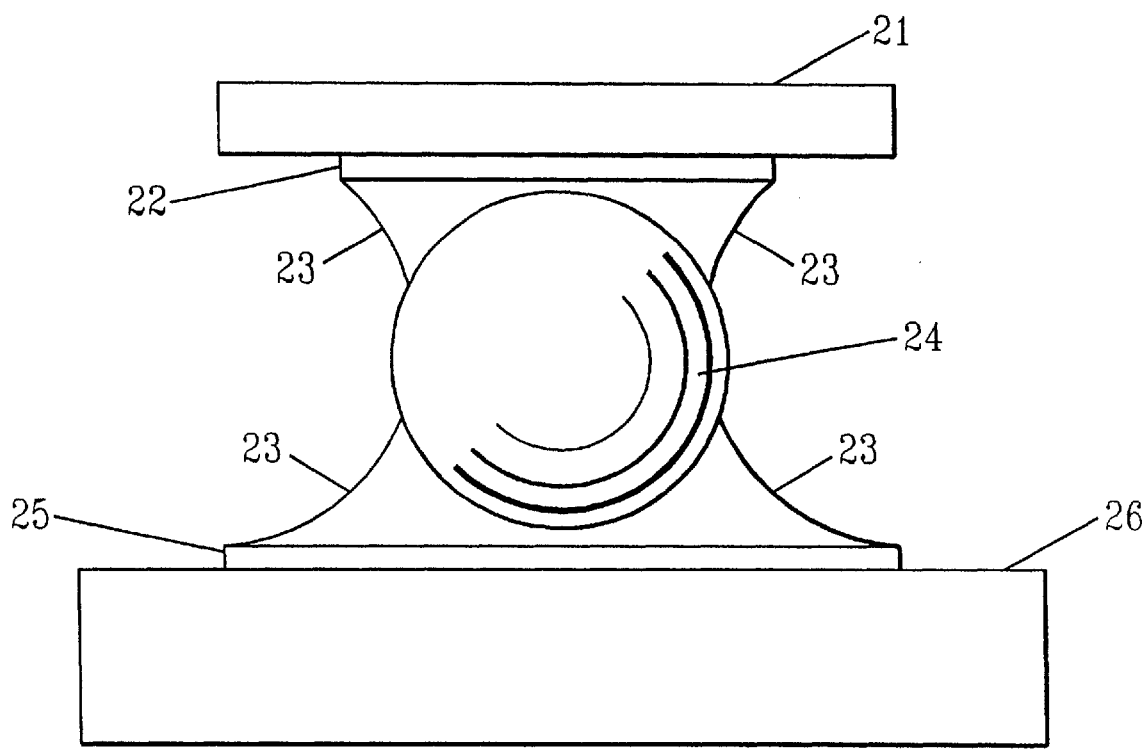
FIG. 2 is a schematic cross-sectional illustration representing a typical prior art solder ball connection in a ceramic BGA, where a high Pb solder ball connects a BGA module to a PCB by melting Pb-Sn eutectic solder paste.
Figure 3:
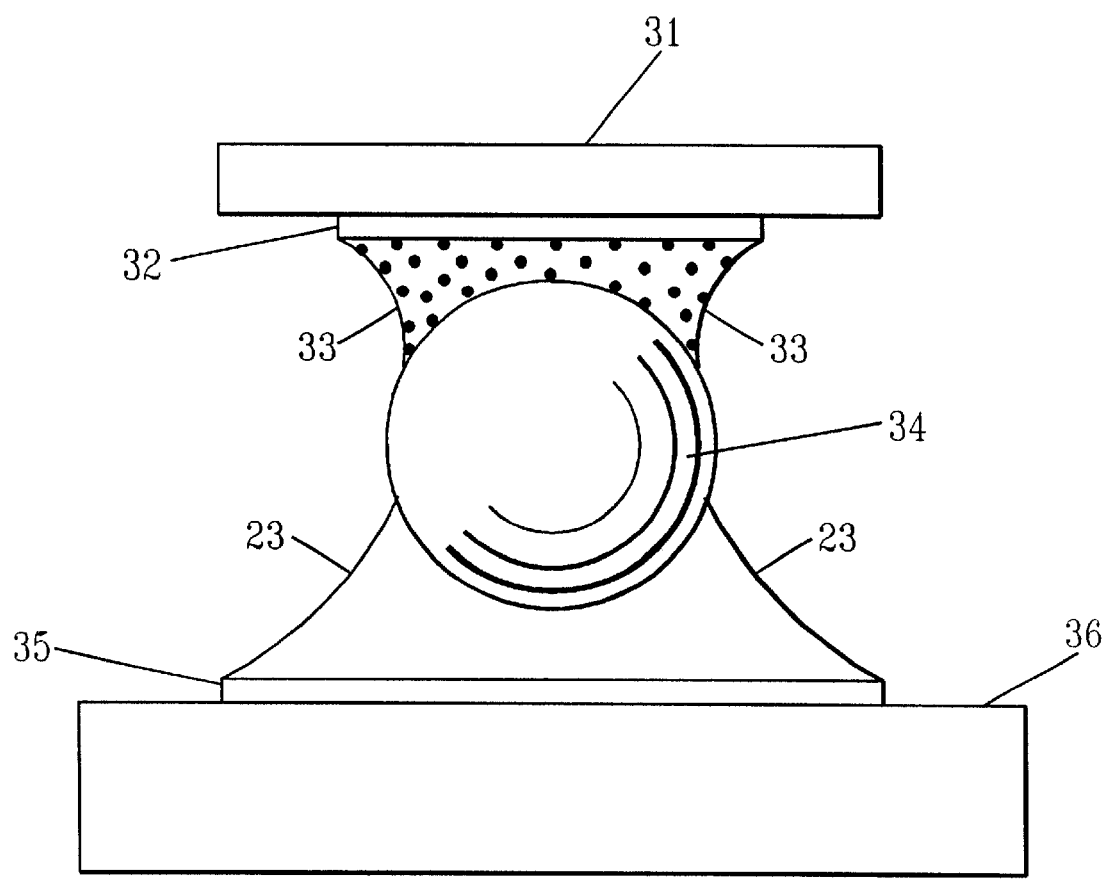
FIG. 3 is a schematic cross-sectional illustration representing a new solder ball connection scheme in a ceramic BGA. The solder ball is connected to a ceramic module by use of the new electrically conductive paste according to the present invention, while it is connected to a printed circuit board by use of Pb-Sn eutectic solder paste.

According to an embodiment of the present invention, an example of a ceramic BGA module is schematically shown in FIG. 3, where the joining of a solder ball 34 to a ceramic module 31 is accomplished by using an electrically conductive adhesive 33 and the joining of said solder ball 34 to the printed wiring board 36 is accomplished using a solder paste connection 35. The interface in the vicinity of the module is represented by 32 and that in the vicinity of the printed wiring board is represented by 23.

Examples of suitable electrically conductive adhesives 33 are disclosed in U.S. Ser. No. 08/641,406; U.S. Ser. No. 08/883,188; U.S. Ser. No. 60/052,172; U.S. Ser. No. 08/868,771 and U.S. Ser. No. 08/877,991, all of which are assigned to International Business Machines Corporation, the assignee of the present application, and entire disclosures of which are incorporated herein by reference.

These electrically conductive paste materials comprise conducting filler particles dispersed in a matrix of thermoplastic and/or thermoset polymer resin optionally with other ingredients. The electrically conducting adhesive preferably comprises:

a thermoplastic or thermoset polymer resin matrix, no-clean solder flux, and a plurality of electrically conducting particles with an electrically conducting fusible coating with at least some of the conducting particles being fused to other of the conducting particles through the electrically conductive fusible coating.

Preferably, the conducting particles are about 1 to about 50 micrometers in diameter. Preferably the electrically conducting fusible coating layer is about 0.1 to about 2 micrometers in thickness.

Typical examples of suitable polymer resin matrix materials are polyimides, siloxanes, polyimide-siloxanes, phenoxy polymers, styrene allyl alcohol polymers, epoxies and bio-based polymeric resins derived from at least one member of lignin, cellulose, wood oil, crop oil, or mixtures thereof.

Typical electrically conducting particles are Cu, Au, Ag, Al, Pd, Pt, mixtures and alloys thereof.

Typical electrically conducting fusible coatings are Sn, Zn, In, Pb, Bi and Sb, or combinations thereof.

By way of example, in U.S. Ser. No. 06/641,406, a Sn-plated Cu powder dispersed in a polymer resin matrix is disclosed. In U.S. Ser. No. 08/868,771, an In-plated Cu dendrite powder dispersed in a resin matrix is disclosed. In U.S. Ser. No. 60/052,172, a Bi/Sn-alloy-plated CU powder dispersed in a polymer resin matrix is disclosed. In U.S. Ser. No. 60/052,172 an In/Sn-plated (or Bi/Sn-plated) Cu dendrite powder dispersed in a polymer resin matrix is disclosed.

In order to demonstrate good mechanical properties of the electrically conductive materials, test samples are assembled by joining two "L" shaped Cu coupons into a cross-shaped joint. Several different joining materials are used for comparison: Sn—Pb eutectic solder paste, Ag-filled epoxy and a conductive adhesive with different levels of filler loading. Mechanical properties of the joint samples are measured by shearing a "2L" joint sample apart and measuring the elongation to break and shear strength. For each group of samples, joint strength and elongation at fracture are summarized in Table 1 below. Sn/Pb solder joints demonstrate the highest joint strength among all the sample groups, while that of the Ag-epoxy joints showed the lowest joint strength. The joint strength of the new conductive adhesive joints is varied according to the level of filler loading. For the low loading, the joint strength is very close to that of the Sn/Pb solder joint, while for the high loading the joint strength close to that of the Ag-epoxy joints. Elongation at fracture is compared among the different joints The conductive adhesive joints made of Sn-coated Cu filler in a thermoplastic polymer resin (with low and medium filler loading) shows a better elongation value than that of the Sn/Pb solder joint. In all filler levels, the elongation values of the conductive adhesive are larger than that of the Ag-epoxy joint. A maximum elongation value with adequate strengths can be a good barometer which would predict the thermal fatigue life of a joint structure. In this regard, the thermal fatigue life of a BGA structure assembled by using the conductive adhesive materials is expected to be better or equivalent to that assembled with the solder paste.

Figure 4:
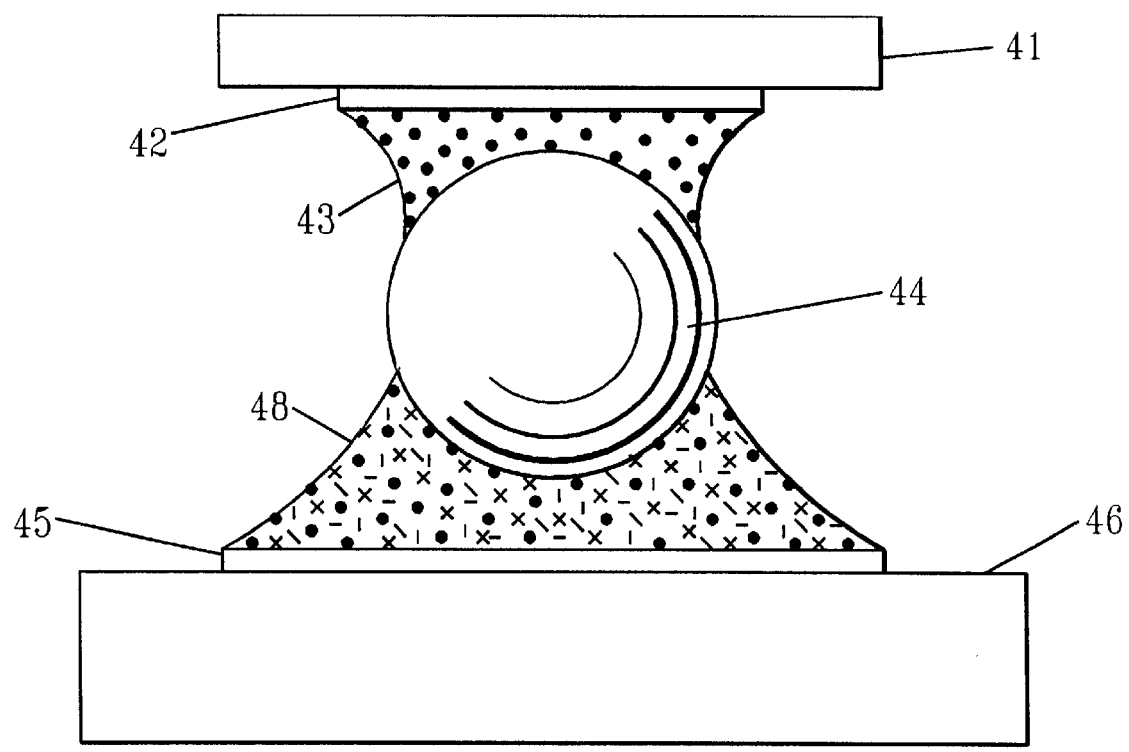
FIG. 4 is a schematic cross-sectional illustration representing a new solder ball connection scheme in a ceramic BGA, where a high Pb solder ball is connected to contact pads on both sides by use of the new electrically conductive materials according to the present invention.
Figure 5:
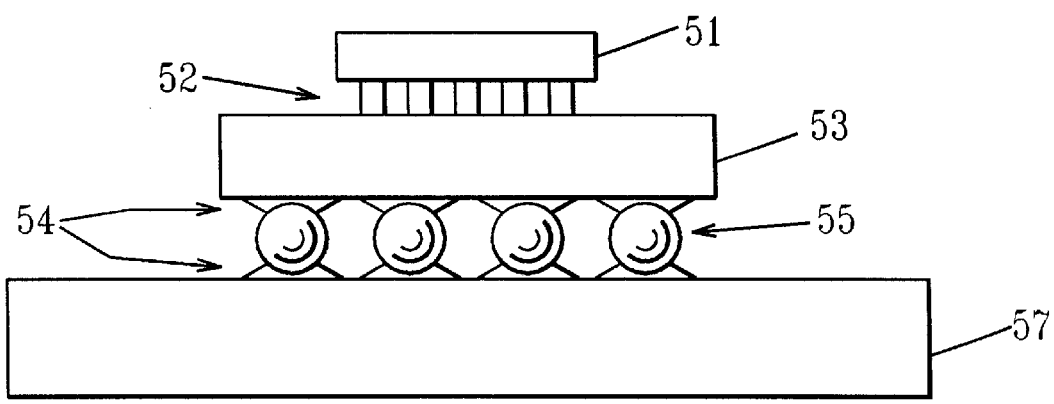
FIG. 5 is a schematic illustration representing a new solder ball connection scheme of a ceramic BGA, where the BGA module is connected to a PCB by use of a solder ball and electrically conductive paste materials. In addition, an IC device on the module is also connected by the electrically conductive adhesive bumps made of the new conductive adhesive materials according to the present invention.

FIG. 4 illustrates another embodiment of the present invention, where both sides of a BGA solder ball 44 are attached by use of the electrically conductive adhesives replacing the solder paste completely. For the BGA module side 41, a conductive adhesive 43 of Sn-plated Cu powder is applied, while for the organic printed circuit board side 46, a conductive adhesive 48, with a filler material such as In-coated Cu dendrite, or In/Sn-coated Cu dendrite, or Bi/Sn-coated Cu powder, can be applied to be joined at a low temperature. The low temperature joining process can reduce a residual stress in a printed circuit board in comparison to the conventional solder reflow case. The end result is therefore a beneficial effect to the overall reliability of the BGA assembly. An assembly temperature hierarchy is also achieved so that the BGA modules can be attached or removed from the PCB without melting the ball-to-module joints. The interface in the vicinity of the module is represented by 42 and that in the vicinity of the printed wiring board is represented by In another embodiment of the present invention, the usage of the electrically conductive adhesive is extended to replace the solder bumps connecting an IC to the BGA module, as depicted in FIG. 5. Here the traditional solder bumps are replaced by the conductive adhesive bumps 52, which are dispensed on each chip 51 of a silicon wafer by screen or stencil printing for jointing the IC 51 to/module 53. For a ceramic BGA module, the conductive adhesive with Sn-plated Cu filler is a good choice as the bump material, while for an organic BGA module the conductive adhesive materials which can be joined at a lower temperature should be chosen. Joining of solder balls 55 to printed wiring board 57 is accomplished by using a solder paste connector 54.

By way of a particular example, in U.S. Ser. No. 08/641,406, one specific embodiment discloses an electrically conductive paste made of tin-coated copper powder, polyimide-siloxane, solvent, carboxylic acid/surfactant, and no-clean flux. A joining operation can be performed near the melting point of Sn, 230° C., where a metallurgical bonding of Sn-to-Sn or Sn-to-Au is accomplished at the particle-to-particle as well as particle-to-substrate pad interfaces. Because of the metallurgical bonding, a higher electrical conductivity as well as a higher joint strength were demonstrated with the joints made of the paste material than with those of the silver-filled epoxy material. The metallurgical bonds also provided a stable electrical conductivity of the new joints upon thermal exposure and cycling. In another patent application U.S. Ser. No. 60/052,172, an electrically conductive paste made of bismuth-tin coated copper powder, thermoplastic polymer resin, solvent, and no-clean flux is disclosed. A joining operation can be performed near the eutectic temperature of the Bi—Sn alloy, which is about 139° C. In another patent application U.S. Ser. No. 08/868,771, an electrically conductive paste made of indium-tin coated copper powder, thermoplastic polymer resin, solvent, and no-clean flux is disclosed. A joining operation can be performed near the eutectic temperature of the In—Sn alloy, which is 120° C. The electrically conductive pastes with either Bi—Sn coated or In—Sn coated Cu powder can be used with polymeric printed circuit boards, while that with Sn-coated Cu powder can be used with ceramic substrates.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

TABLE 1

| Joining Materials | Mechanical Properties of Model Joints | | |
|---|---|---|---|
| | Filler level (wt %) | Joint* Strength (lb) | Elongation* at fracture(") |
| Ag-Epoxy | 60–80 | 6.6 | 0.0028 |
| Sn/Pb solder paste | >90 | 10.2 | 0.0088 |
| New cond. adhesive | high | 5.6 | 0.0038 |
| New cond. adhesive | medium | 7.2 | 0.0098 |
| New cond. adhesive | low | 9.5 | 0.0135 |

*Average value of 5 measurements; joint area is about 1.25 mm in diameter.
*Average thickness of model joints is about 0.025 mm.

What is claimed is:
1. A structure comprising:
a plurality of electrically conducting spheres disposed in an array on an electronic chip carrier module;
said spheres being electrically and mechanically joined to terminal pads on the module by means of an electrically conducting adhesive;
said spheres being electrically and mechanically joined to terminal pads on a printed circuit board by solder paste; and wherein the said electrically conducting adhesive comprises:
a thermoplastic or thermosetting polymer resin matrix, no-clean solder flux,
a plurality of electrically conducting particles with an electrically conductive and fusible coating with at least some of said particles being fused to other said particles through said electrically conductive fusible coating.

2. A structure according to claim 1, wherein the electrically conducting spheres disposed in said array are made of at least one material selected from the group consisting of Pb, Sn, In, Bi, Sb, Zn, and alloys thereof.

3. A structure according to claim 1, wherein said electrically conducting particles are formed from at least one material selected from the group consisting of Cu, Au, Ag, Al, Pd, and Pt.

4. A structure according to claim 1, wherein said electrical coating is selected from the group consisting of Sn, Zn, In, Pb, Bi, and Sb, and combinations thereof.

5. A structure according to claim 1, wherein said polymeric material is selected from the group consisting of polyimide, siloxane, polyimide-siloxane, phenoxy polymers, styrene allyl alcohol polymers, epoxies and bio-based polymeric resins derived from at least one material selected from the group consisting of lignin, cellulose, wood oil and crop oil.

6. A structure according to claim 1, wherein said polymeric material provides adhesive joining of said terminal pads.

7. A structure according to claim 1, wherein said conducting particles are about 1 to about 50 micrometers in diameter.

8. A structure according to claim 1, wherein said fusible coating layer is about 0.1 to about 2 micrometers in thickness.

9. A structure according to claim 1, wherein said structure is an electronic device.

10. A structure according to claim 1, wherein said stricture is a computing device.

11. A structure according to claim 1, wherein said structure is a ball grid array (BGA) electronic package.

12. A structure according to claim 11, wherein said electrically conducting particles are formed from at least one material selected from the group consisting of Cu, Au, Ag, Al, Pd, and Pt;

electrical coating is selected from the group consisting of Sn, Zn, In, Pb, Bi, and Sb, and combinations thereof; and said polymeric material is selected from the group consisting of polyimide, siloxane, polyimide- siloxane, phenoxy polymers, styrene allyl alcohol polymers, epoxies and bio-based polymeric resins derived from at least one material selected from the group consisting of lignin, cellulose, wood oil and crop oil.

13. A structure according to claim 1, wherein the attachment of the said spheres with the said conducting adhesive is achieved by the application of heat and pressure for a duration of time.

14. A structure according to claim 1, wherein the said chip carrier module is selected from the group comprising a metallized ceramic, multilayer cofired ceramic, an organic film optionally provided with a rigid frame, and a section of a printed wiring board.

15. A structure comprising:

a plurality of electrically conducting spheres disposed in an array on an electronic chip carrier module;

said spheres being electrically and mechanically joined to terminal pads on the module by means of an electrically conducting adhesive;

said spheres being electrically and mechanically joined to terminal pads on a printed circuit board by means of another electrically conducting adhesive; and wherein the said electrically conducting adhesive comprises:

a thermoplastic or thermosetting polymer resin matrix, no-clean solder flux, a plurality of electrically conducting particles with an electrically conductive and fusible coating with at least some of said particles being fused to other said particles through said electrically conductive fusible coating.

16. A structure according to claim 15, wherein the electrically conducting spheres disposed in the array are made of at least one material selected from the group consisting of Pb, Sn, In, Bi, Sb, Zn, and alloys thereof.

17. A structure according to claim 15, wherein said particles are formed from at least one material selected from the group consisting of Cu, Au, Ag, Al, Pd, and Pt.

18. A structure according to claim 15, wherein said electrical coating is selected from the group consisting of Sn, Zn, In, Pb, Bi, and Sb, and combinations thereof.

19. A structure according to claim 15, wherein said polymeric material is selected from the group consisting of polyimide, siloxane, polyimide-siloxane, phenoxy polymers, styrene allyl alcohol, epoxies and bio-based polymeric resins derived from at least one material selected from the group consisting of lignin, cellulose, wood oil and crop oil.

20. A structure according to claim 15, wherein said polymeric material provides adhesive joining of said terminal pads.

21. A structure according to claim 15, wherein said conducting particles are about 1 to about 50 micrometers in diameter.

22. A structure according to claim 15, wherein said fusible coating layer is about 0.1 to about 2 micrometers in thickness.

23. A structure according to claim 15, wherein said structure is an electronic device.

24. A structure according to claim 15, wherein said structure is a computing device.

25. A structure according to claim 15, wherein said structure is a ball grid array (BGA) electronic package.

26. A structure according to claim 25 wherein said electrically conducting particles are formed from at least one material selected from the group consisting of Cu, Au, Ag, Al, Pd, and Pt;

electrical coating is selected from the group consisting of Sn, Zn, In, Pb, Bi, and Sb, and combinations thereof; and said polymeric material is selected from the group consisting of polyimide, siloxane, polyimide- siloxane, phenoxy polymers, styrene allyl alcohol polymers, epoxies and bio-based polymeric resins derived from at least one material selected from the group consisting of lignin, cellulose, wood oil and crop oil.

27. A structure according to claim 15, wherein the attachment of the said spheres with the said conducting adhesive is achieved by the application of heat and pressure for a duration of time.

28. A structure according to claim 15, wherein the said chip carrier module is selected from the group comprising a metallized ceramic, multilayer cofired ceramic, an organic film optionally provided with a rigid frame, and a section of a printed wiring board.

29. A structure comprising:

a plurality of electrically conducting spheres disposed in an array on an electronic chip carrier module;

said spheres being electrically and mechanically joined to terminal pads on the module by means of an electrically conducting adhesive;

said spheres being electrically and mechanically joined to terminal pads on a printed circuit board by means of another electrically conducting adhesive;

said electronic chip carrier module being electrically connected to an integrated circuit device by an array of conductive bumps made of an electrically conducting adhesive, and wherein the said electrically conducting adhesive is a mixture comprising:

a thermoplastic or thermosetting polymer resin matrix, no-clean solder flux, a plurality of electrically conducting particles with an electrically conductive and fusible coating with at least some of said particles being fused to other said particles through said electrically conductive fusible coating.

30. A structure according to claim 29, wherein the electrically conducting spheres disposed in the array are made of at least one material selected from the group consisting of Pb, Sn, In, Bi, Sb, Zn, and alloys thereof.

31. A structure according to claim 29, wherein said electrically conducting particles are formed from at least one material selected from the group consisting of Cu, Au, Ag, Al, Pd and Pt.

32. A structure according to claim 29, wherein said electrical coating is selected from the group consisting of Sn, Zn, In, Pb, Bi, and Sb, and combinations thereof.

33. A structure according to claim 29, wherein said polymeric material is selected from the group consisting of polyimide, siloxane, polyimide-siloxane, phenoxy polymers, styrene allyl alcohol polymers, epoxies and bio-based polymeric resins derived from at least one material selected from the group consisting of lignin, cellulose, wood oil and crop oil.

34. A structure according to claim 29, wherein said polymeric material provides adhesive joining of said terminal pads.

35. A structure according to claim 29, wherein said conducting particles are about 1 to about 50 micrometers in diameter.

36. A structure according to claim 29, wherein said fusible coating layer is about 0.1 to about 2 micrometers in thickness.

37. A structure according to claim 29, wherein said structure is an electronic device.

38. A structure according to claim 29, wherein said structure is a computing device.

39. A structure according to claim 29, wherein said structure is a ball grid array (BGA) electronic package.

40. A structure according to claim 39, wherein said electrically conducting particles are formed from at least one material selected from the group consisting of Cu, Au, Ag, Al, Pd, and Pt;

electrical coating is selected from the group consisting of Sn, Zn, In, Pb, Bi, and Sb, and combinations thereof; and said polymeric material is selected from the group consisting of polyimide, siloxane, polyimide- siloxane, phenoxy polymers, styrene allyl alcohol polymers, epoxies and bio-based polymeric resins derived from at least one material selected from the group consisting of lignin, cellulose, wood oil and crop oil.

41. A structure according to claim 29, wherein the attachment of the said spheres with the said conducting adhesive is achieved by the application of heat and pressure for a duration of time.

42. A structure according to claim 29, wherein the said chip carrier module is selected from the group comprising a metallized ceramic, multilayer cofired ceramic, an organic film optionally provided with a rigid frame, and a section of a printed wiring board.

* * * * *

UNITED STATES PATENT AND TRADEMARK OFFICE
CERTIFICATE OF CORRECTION

| | |
|---|---|
| PATENT NO. : 6,297,559 B1 | |
| DATED : October 2, 2001 | |
| INVENTOR(S) : Anson J. Call et al. | |

It is certified that error appears in the above-identified patent and that said Letters Patent is hereby corrected as shown below:

<u>Column 7,</u>
Line 33, change "stricture" to -- structure --.

Signed and Sealed this

Twenty-sixth Day of March, 2002

Attest:

JAMES E. ROGAN
*Attesting Officer*           *Director of the United States Patent and Trademark Office*